United States Patent [19]

Wolny et al.

[11] Patent Number: 5,981,950
[45] Date of Patent: Nov. 9, 1999

[54] MULTICOLOR PHOTONIC RADIATION DETECTOR

[75] Inventors: Michel Wolny, Grenoble; Gérard Destefanis, Saint-Egreve, both of France

[73] Assignee: Commissariat a l'Energie Atomique, Paris, France

[21] Appl. No.: 09/013,210

[22] Filed: Jan. 26, 1998

[30] Foreign Application Priority Data

Feb. 7, 1997 [FR] France .................................. 97 01439

[51] Int. Cl.⁶ ...................... H01L 25/065; H01L 27/146; G01J 5/22
[52] U.S. Cl. ................................ 250/338.4; 250/370.06; 250/332; 250/339.02; 250/370.14; 250/370.08; 438/74
[58] Field of Search .................. 250/370.06, 370.08, 250/332, 338.1, 339.01, 339.02; 438/57, 73, 74

[56] References Cited

U.S. PATENT DOCUMENTS

| | | |
|---|---|---|
| 3,962,578 | 6/1976 | Roschen . |
| 4,206,470 | 6/1980 | White . |
| 4,956,686 | 9/1990 | Borrello et al. ................ 250/440 |
| 5,113,076 | 5/1992 | Schulte . |
| 5,300,777 | 4/1994 | Goodwin . |
| 5,373,182 | 12/1994 | Norton . |
| 5,374,841 | 12/1994 | Goodwin . |
| 5,380,669 | 1/1995 | Norton . |
| 5,512,750 | 4/1996 | Yanka et al. ................. 250/338.4 |
| 5,517,029 | 5/1996 | Yanka et al. ................. 250/332 |

FOREIGN PATENT DOCUMENTS

| | | |
|---|---|---|
| 0 654 826 | 5/1995 | European Pat. Off. . |
| 35 33 146 | 3/1987 | Germany . |

OTHER PUBLICATIONS

M.B. Reine, et al., Journal of Electronic Materials, vol. 24, No. 5, pp. 669–679, 1995, "Independently Accessed Back-To-Back HGCDTE Photodiodes: A New Dual-Band Infrared Detector".

G.L. Destefanis, Semicond. Sci. Technol., vol. 6, pp. C88–C92, 1991, "HGCDTE Infrared Diode Arrays".

J.L. Tissot, et al., IRIS, Jun. 25–28, 1996, "Advanced Hybridisation Technology For HGCDTE IRFPA".

*Primary Examiner*—Constantine Hannaher
*Assistant Examiner*—Albert Gagliardi
*Attorney, Agent, or Firm*—Oblon, Spivak, McClelland, Maier & Neustadt, P.C.

[57] ABSTRACT

A multicolor radiation detector capable of detecting at least two incident radiations with two distinct wave lengths $\lambda i1$ and $\lambda s1$ where wave length $\lambda s1$ is greater than wave length $\lambda i1$. The multicolor radiation detector includes two detection components. The first detection component is configured to detect at least the radiation with wave length $\lambda i1$ and to be transparent to at least to the radiation of wave length $\lambda s1$. The first detection component includes a matrix of detection pixels of n1 rows and m1 columns and a matrix of reading pixels of n1 rows and m1 columns wherein the reading pixels are transparent to the radiation with wave length $\lambda s1$ in at least one portion of each pixel. The second detection component is configured to detect at least the radiation with wave length $\lambda s1$. The second detection component includes a matrix of detection pixels of n2 rows and m2 columns and a matrix of reading pixels of n2 rows and m2 columns. The first detection component is configured to face incident radiation such that the first detection component receives the incident radiation of wave length $\lambda i1$ before the second detection component receives the radiation of wave length $\lambda s1$ and n1, m1, n2 and m2 are whole numbers equal to or greater than one.

12 Claims, 6 Drawing Sheets

MULTICOLOR PHOTONIC RADIATION DETECTOR

DESCRIPTION

1. Technical Field

This invention relates to a multicolor photonic radiation detector.

It is applicable particularly to:

the detection of infrared radiation in the range of wave lengths between 2 μm and 30 μm;

the detection of radiation in several spectral bands, particularly in atmospheric transmission windows between 3 μm and 5 μm, and between 8 μm and 12 μm, and thermal imagery.

The invention is particularly applicable to the manufacture of imagery cameras and missile homing heads.

2. State of Prior Art

The most frequently used high performance infrared detectors at the present time are based on a technique of hybridizing a detection chip on a reading chip through a network of microballs (for example based on indium) providing the electric and mechanical connection between the two chips.

The reading chip, which reads signals detected by each pixel on the detection chip and multiplexes them onto a single output or a small number of outputs, is a silicon based analogue circuit.

The complexity of this chip (size, density, analogue nature) makes it impossible to reasonably consider any other technology for making it.

The detection chip is generally composed of a large number of pixels arranged in a two-dimensional structure with i×j pixels (for example 128×128, 256×256 or 640×480 pixels), or possibly in a single dimensional or quasi-single dimensional structure with i×j pixels, where i is equal to 1 or is very much less than j (for example 4×288 or 4×480 pixels).

Several technologies may be considered for making this detection chip.

These technologies are distinguished by the materials and/or devices and processes used for their manufacture.

For example (non-exhaustively) there are technologies using $Cd_xHg_{1-x}Te$ ($0 \leq x \leq 1$) alloys epitaxied by any technique (EPL, EJM, MOVPE, ISOVPE, etc.) onto a $Cd_{1-z}Zn_zTe$ substrate ($0 \leq z \leq 1$), with a suitable mesh parameter or on another substrate (Si, GaAs, $Al_2O_3$, Ge, etc.).

These technologies currently provide components with the best performances, over a wide spectral range (typically 2 μm to 18 μm or even more).

There are several technological variants for manufacturing detection components on these structures (planar, mesa, etc.).

We could also mention:

technologies based on antimonides: InSb, GaInSb/InAs, InSb/InAsSb supernetworks, etc., technologies based on inter sub-band absorption in quantic dots (GaAs/GaAlAs multi-quantic dots and their variants), technologies based on silicides (PtSi, IrSi, etc.) or $Si_{1-x}Ge_x$ alloys, and technologies based on lead salts (PbS, PbSSe, PbSnTe, etc.).

Figure 1A:
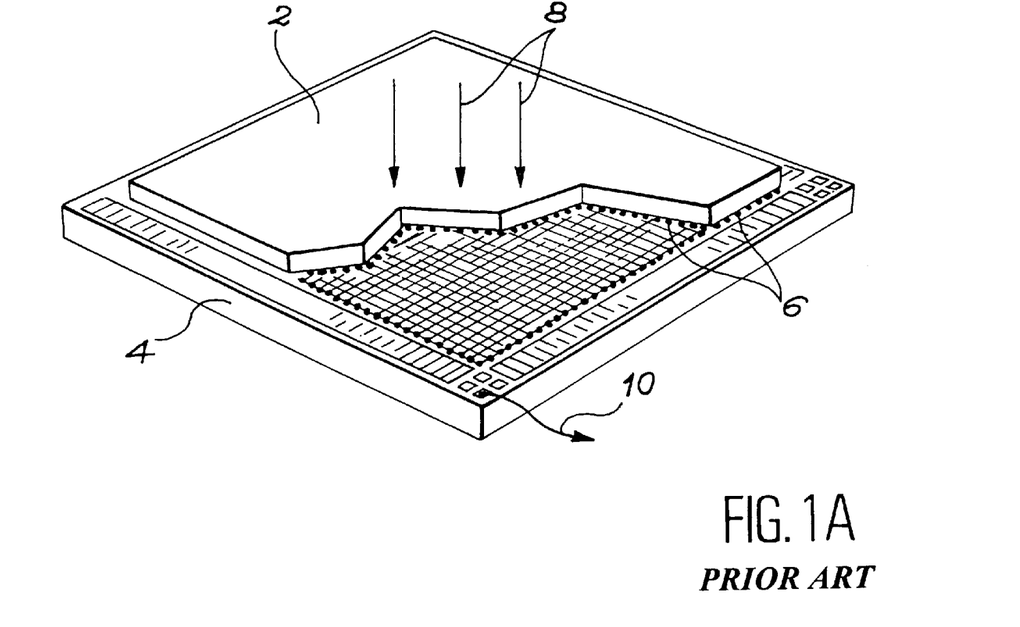
FIG. 1A, already described, is a schematic perspective view of a known radiation detector, FIG. 1B, already described, is a schematic sectional view of a pixel in the detection circuit of the detector in FIG. 1A, FIGS. 2A to 2F are schematic cross-sectional views of detectors conform with the invention.

FIG. 1A shows a schematic view of a two-dimensional infrared radiation detector comprising a detection circuit 2 hybridized on a silicon reading circuit 4 through metallic interconnections 6.

When the detection circuit 2 receives infrared radiation 8, the reading circuit 4 outputs a video signal 10.

Figure 1B:
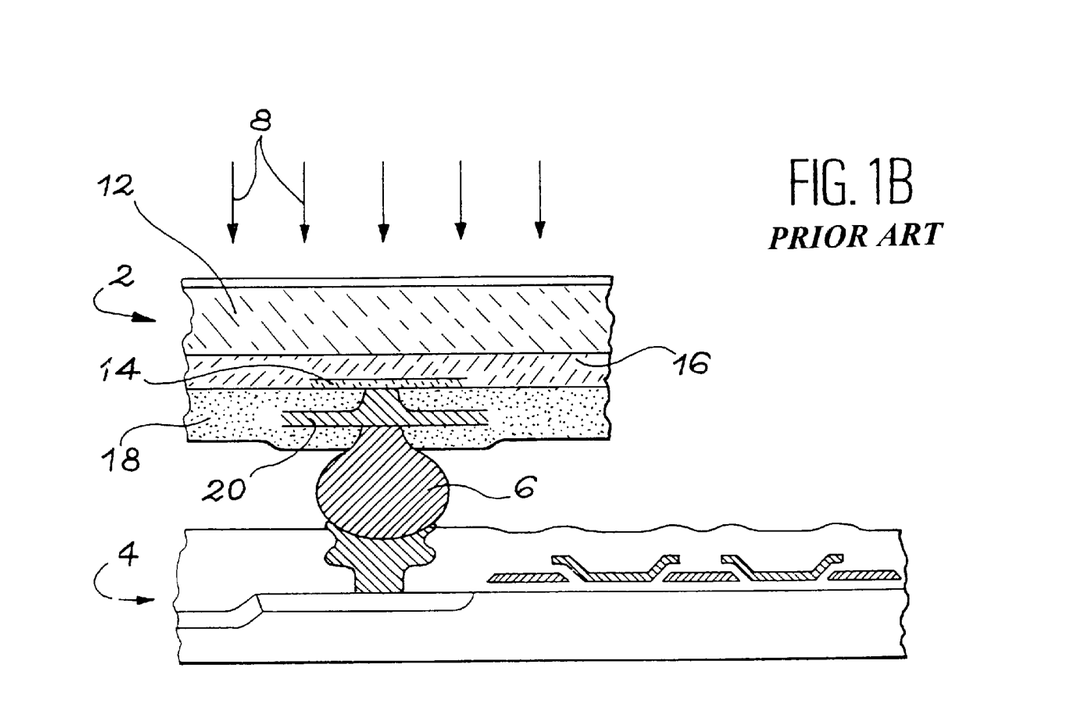

FIG. 1B is a schematic sectional view of a detection pixel or detection element in the detection circuit 2.

In this FIG. 1B, reference 2 represents the detection circuit, reference 4 represents the silicon reading circuit, and reference 6 represents a metallic interconnection (indium ball).

The following can be seen in the detection circuit, at the detection element:

a substrate 12 made of CdZnTe, an N type area 14 in a PN junction made of CdHgTe, an P type area 16 in this PN junction made of CdHgTe, a passivation layer 18 and, a contact 20.

A strong demand has recently developed for components capable of detecting an infrared signal with at least two different wave lengths, for example 5 μm and 10 μm.

There are applications for this type of component in domains such as missile homing heads, the determination of spectral signatures and target identification.

Several technological solutions have already been proposed to make this type of detector.

In most cases, they consist of making a single detection circuit connected to a reading circuit, the detection circuit being made from a stack of materials capable of detecting the required wave lengths, for example two wave lengths λ1 and λ2.

For further information on this subject, please refer to documents 1 to 5 which, like other documents referenced later, are mentioned at the end of this description.

These solutions require epitaxial structures that are difficult to make.

Furthermore, there is no easy way of providing a large amount of flexibility in the choice of materials that can be used to detect each wave length; preferably, these materials must belong to the same family (for example CdHgTe alloys with different compositions), otherwise there may be serious technological difficulties in growing the structures.

Furthermore, since only one reading circuit is used to read the two signals corresponding to the two wave lengths to be detected, its design is difficult particularly if it is required to control the space-time consistency of the information for each wave length.

Furthermore, in this type of structure there is usually a non-negligible risk of intermodulation between signals corresponding to each of the two wave lengths to be detected (for example presence of a signal of wave length λ1 in the diode intended to read the signal of wave length λ2).

Finally, in this type of structure it is usually necessary to define active pixel areas by etching a mesa structure, which makes the manufacturing process more difficult.

It should be emphasized that in the case of documents 4 and 5, the detection mode used is based on MIS (or SIS) structures on CdHgTe, and these structures are difficult to control.

Other solutions are suggested in documents 6, 7 and 8.

These have the following disadvantages.

With the solution mentioned in document 6, it is only possible to use single element detectors or detectors with a very small number of pixels.

With the solution mentioned in document 7, the only possible architecture is in linear strips.

At best, a component with i×j pixels could be designed where j is less than 5 (typically).

The solution mentioned in document 8 suggests the combination of a detector in the visible range and a detector in the infrared range which could be dual color.

It is made quite clear that with this solution, the detector placed on the first substrate used is a detector in the visible range.

Furthermore, there is not obviously any guarantee of the spatial consistency of the information corresponding to the two detected wave lengths, considering the figures in this document 8.

DESCRIPTION OF THE INVENTION

This invention solves the problem of designing a detector:
that may be capable of detecting at least two radiations with different wave lengths, for example located in the infrared range,
that may be extremely complex, in other words may contain a large number of pixels,
that may have a two-dimensional topology,
that may lead to a very good spectral separation of the two radiations to be detected,
that may guarantee the space-time consistency of information corresponding to the two wave lengths output from each pixel and,
that may be made with a sufficiently small pixel to pixel pitch so that it is not too expensive when it is large, for example corresponding to a 256×256 pixel mosaic.

The detector defined in this invention can easily be produced from existing technologies used industrially.

The following describes the principle of a two-color detector conform with the invention, but obviously this invention also relates to detectors capable of detecting more than two wave lengths and the principle described below can be extended to this type of component.

The following description considers a two-color detector capable of detecting two wave lengths $\lambda s$ and $\lambda i$, where $\lambda s$ is greater than $\lambda i$.

According to this invention, two distinct components are superposed, namely a first component capable of detecting a radiation of wave length $\lambda i$ and a second component capable of detecting a radiation of wave length $\lambda s$, the component capable of detecting the radiation of wave length $\lambda i$ being placed first facing the incident radiation to be detected and being transparent to the wave length $\lambda s$ over a large part of its active area in which the radiation of wave length $\lambda i$ is detected.

Each of these first and second components has a two-dimensional architecture, but it could also have a single-dimensional architecture.

Each of these first and second components includes a reading circuit which is preferably based on silicon.

The detection circuit for each of the first and second components may be either hybridized with its reading circuit, for example by a network of indium micro-balls or it may be monolithically integrated on the reading circuit.

The first and second superposed components preferably have the same number of pixels, these pixels forming a matrix with N lines and M columns, and the same topology (concerning the arrangement of pixels and the pitch between pixels) and are laid out such that the pixels in the first and second components with the same row number i and the same column number j are placed one above the other.

The first component which is capable of detecting a radiation of wave length $\lambda i$ is made transparent because its detection circuit and its reading circuit are transparent.

The detection circuit is "naturally" transparent (since the detection circuit detects up to $\lambda i$ and allows longer wave lengths to pass) and the reading circuit is made transparent by an appropriate design which leaves a large area of each pixel transparent.

For example the reading circuit may be made of a very slightly doped silicon substrate with a very low oxygen content.

If this is not the case, the silicon substrate could also be made thinner.

An SOI substrate could also be used to make the reading circuit, the inactive part of the substrate subsequently being removed.

Specifically, this invention relates to a multicolor radiation detector, this detector being capable of detecting at least two incident radiation with two distinct wave lengths $\lambda i1$ and $\lambda s1$ respectively where $\lambda s1 > \lambda i1$, this detector being characterized in that it comprises:

a first component capable of detecting at least the radiation with wave length $\lambda i1$, and a second component capable of detecting at least the radiation with wave length $\lambda s1$, the first component being placed facing incident radiation such that this first component receives the radiation of wave length $\lambda i1$ before the second component receives the radiation of wave length $\lambda s1$, the first component being transparent at least to the radiation of wave length $\lambda s1$ in a large part of the active area of this first component, in which the radiation of the wave length $\lambda i1$ is detected, the first component comprising a detection circuit and a reading circuit that form a matrix of detection and reading pixels of n1 rows and m1 columns, the second component comprising a detection circuit and a reading circuit that form a matrix of detection and reading pixels with n2 rows and m2 columns, where n1, m1, n2 and m2 are whole numbers equal to or greater than 1, the detection and reading pixels in at least part of one of the first and second components being placed facing the detection and reading pixels of the other of these first and second components, respectively.

The first component may also be capable of detecting another radiation of wave length $\lambda i2$ less than the wave length of each radiation that the second component is capable of detecting.

The second component may also be capable of detecting another radiation of wave length $\lambda s2$ greater than the wave length of each radiation that the first component is capable of detecting.

According to a first specific embodiment of the detector according to the invention, the detection circuit in at least one of the first and second components is hybridized to its reading circuit.

Circuits may be hybridized with each other by means of electrically conducting micro-balls.

According to a second specific embodiment, the detection circuit of at least one of the first and second components is monolithically integrated into its reading circuit.

The first and second components may have the same number of pixels, where n1 is equal to n2 and m1 is equal to m2.

They may also have the same topology, in other words the same arrangement of pixels and the same pitch between pixels.

The detector described in the invention may also comprise anti-reflection layers capable of preventing reflections of radiation on the surfaces of this detector in order to avoid radiation losses.

It may also comprise filtering or absorption means for radiation with wave lengths less than or equal to each wave length that the second component is capable of detecting.

Each reading circuit may be based on silicon.

Each radiation may be infrared radiation.

BRIEF DESCRIPTION OF DRAWINGS

This invention will better understood after reading the following description of example embodiments given for guidance only and in no way restrictive, referring to the drawings in the appendix in which.

DETAILED DESCRIPTION OF SPECIFIC EMBODIMENTS

Figure 2A:
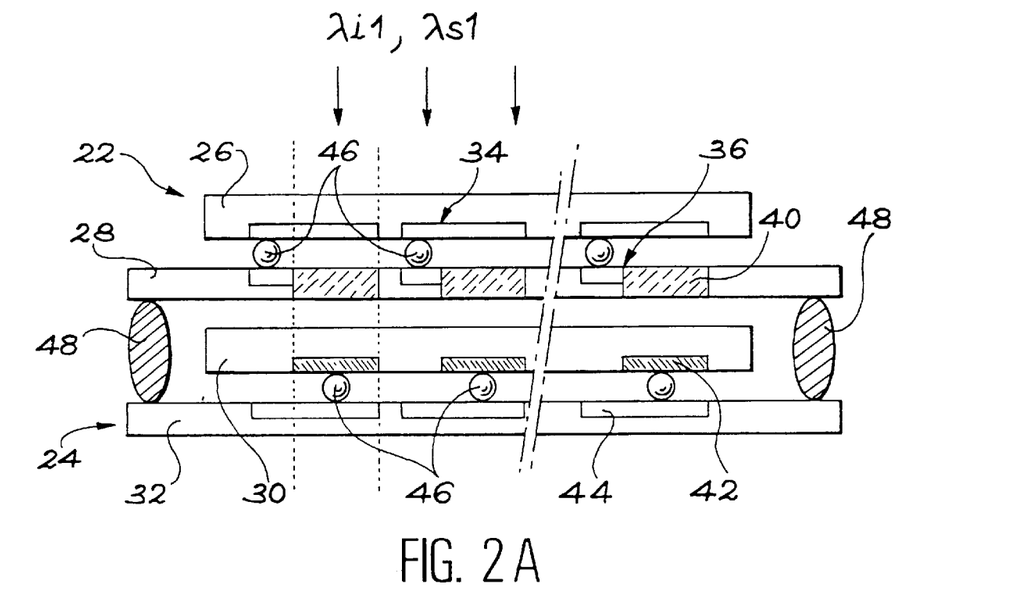

The multicolor radiation detector according to the invention which is schematically represented in a cross-section in FIG. 2A, is designed to detect two incident infrared radiation with two separate wave lengths $\lambda i1$ and $\lambda s1$ respectively, where $\lambda s1 > \lambda i1$.

For example, it may be infrared radiation.

The detector in FIG. 2A comprises:

a first component 22 capable of detecting radiation of wave length $\lambda i1$, and a second component 24 capable of detecting radiation of wave length $\lambda s1$.

The first component 22 is placed facing the incident multicolor radiation such that the first component receives the radiation of gave length $\lambda i1$ before the second component 24 receives the radiation of wave length $\lambda s1$ that it is required to detect.

The first component 22 is transparent to the radiation of wave length $\lambda s1$ in a large part of the active area of this component 22, in which the radiation of wave length $\lambda i1$ is detected.

Furthermore, the first component 22 comprises a detection circuit 26 and a reading circuit 28, and the second component 24 also includes a detection circuit 30 and a reading circuit 32.

The circuit 26 comprises a matrix of detection pixels at $\lambda i1$, reference 34, and the circuit 28 comprises a matrix of reading pixels at $\lambda i1$ reference 36.

The matrix of pixels 34 and the matrix of pixels 36 have the same number of rows and the same number of columns, each pixel 34 being located above one of the pixels 36.

FIG. 2A simply shows one row in each of the matrices in the detector.

In the case shown in FIG. 2A, the entire surface of each pixel 34 may be optically active.

Reference 40 shows the part of each pixel 36 transparent at $\lambda s1$.

The detection circuit 30 includes a matrix of detection pixels at $\lambda s1$ reference 42.

The reading circuit 32 also comprises a matrix of reading pixels at $\lambda s1$ reference 44.

Matrices of pixels 42 and 44 have the same number of rows and the same number of columns, each pixel 42 being located above one of pixels 44.

Circuits 26 and 28 are hybridized to each other, as are circuits 30 and 32.

In the example shown, hybridizations are achieved by means of conducting micro-balls 46, for example made of indium.

Furthermore, each assembly of superposed pixels 34 and 36 is above a set of superposed pixels 42 and 46.

In the example in FIG. 2A, all matrices have the same number of rows and the same number of columns.

Furthermore, in components 22 and 24, the pixels are arranged in the same manner and the pitch between each pixel is the same.

However, in other particularly embodiments not shown, the matrices of pixels 34 and 36 (which have the same number of rows and the same number of columns) do not have exactly the same number of rows and the same number of columns as the matrices of pixels 42 and 44.

For example matrices of pixels 42 and 44 could have more rows and/or more columns than matrices of pixels 34 and 36.

Similarly, in the example shown in FIG. 2A, the arrangement of pixels and the pitch between the pixels are the same in the detection circuits and the reading circuits.

However, in other specific embodiments not shown, the arrangement of pixels and/or the pitch between pixels in component 22 could be different from those in component 24.

FIG. 2A also shows connection elements 48 that could be used to mechanically fix component 22 to component 24, and possibly associate an electrical connection between these components.

In the example shown, these connection elements 48 may for example be made of indium or indium-tin and connect circuit 28 to circuit 32.

In the case shown in FIG. 2A, the detection circuit 26 is illuminated by infrared radiation through its rear surface, which is the surface opposite the surface on which the pixels 34 are formed.

Similarly, the detection circuit 30 is illuminated by the radiation of wave length $\lambda s1$ through its rear surface, in other words the surface opposite the surface on which the pixels 42 are formed.

Figure 2B:
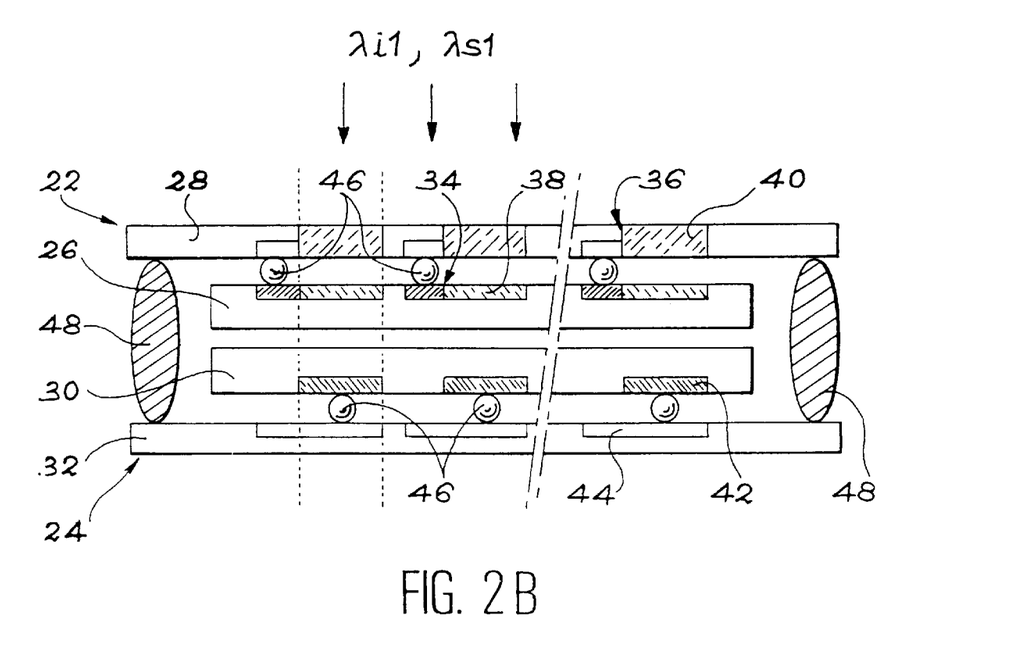

The detector according to the invention, which is schematically represented in cross-section in FIG. 2B, is different from the detector in FIG. 2A by the fact that the first component 22 is turned over, the connection elements 48 still allowing attachment of circuit 32 to circuit 28, and that parts reference 40 are now transparent not only at wave length $\lambda s1$, but also at wave length $\lambda i1$.

In the case shown in FIG. 2B, the component 22 is still composed of the detection circuit 26 and the reading circuit 28, but it is illuminated through the front surface of circuit 26, in other words the surface on which the detection pixels are formed at wave length $\lambda i1$.

In FIG. 2B, reference 38 shows the optically active part of each pixel 34.

Component 24, that detects the radiation of wave length $\lambda s1$, is still composed of the detection circuit 30 and the reading circuit 32 and it is still illuminated through the rear surface of circuit 30.

Figure 2C:
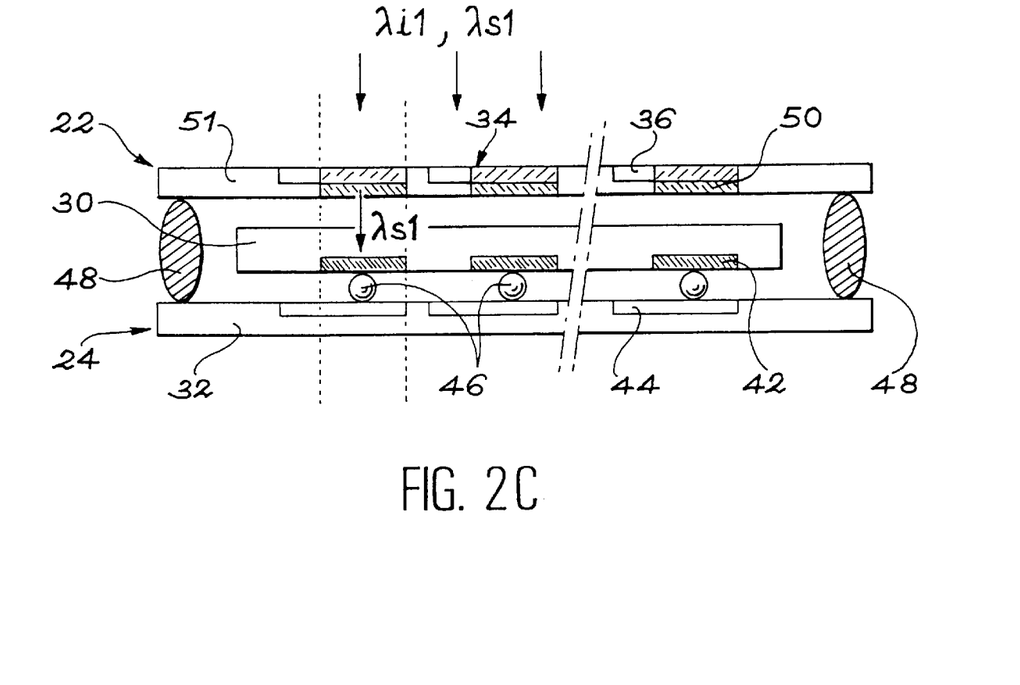

The detector according to the invention, which is schematically shown in cross-section in FIG. 2C, also includes component 24 in FIG. 2A.

However, component 22, in the case shown in FIG. 2C, comprises a detection circuit that is monolithically integrated into a reading circuit and is illuminated through its rear surface.

Component 24 is still illuminated through its rear surface.

FIG. 2C shows the matrix of detection pixels 34 that comprise a part 50 transparent to the wave length $\lambda s1$.

It also shows the matrix of reading pixels 36 formed in the same substrate 51 as the detection pixels 34.

In the case shown in FIG. 2C, the connection elements 48 mechanically and possibly electrically connect this substrate 51 to the reading circuit at wave length $\lambda s1$.

Figure 2D:
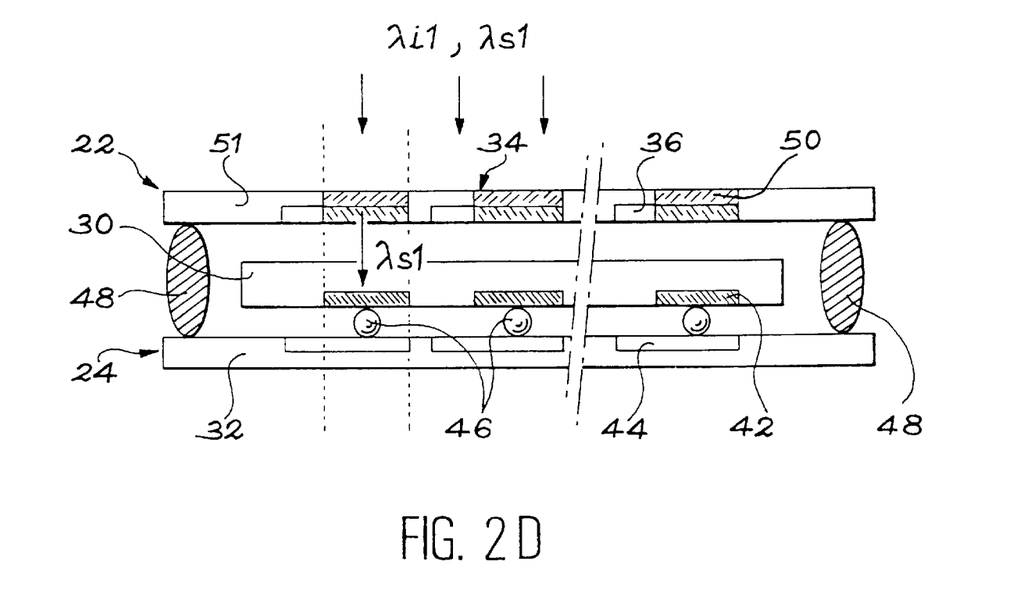

The detector according to the invention, which is schematically represented in cross-section in FIG. 2D, also includes the second component 24 used in the detector in FIG. 2C, but the first component 22 in this FIG. 2C was turned around in the case shown in FIG. 2D.

Under these conditions, the detection circuit of component 22 which detects at wave length $\lambda i1$, is monolithically integrated into its reading circuit and is illuminated through its rear surface, in other words the surface of the substrate opposite the surface on which the detection pixels at wave length $\lambda i1$ are formed.

The detection circuit at wave length $\lambda s1$ is still illuminated through its rear surface.

Figure 2E:
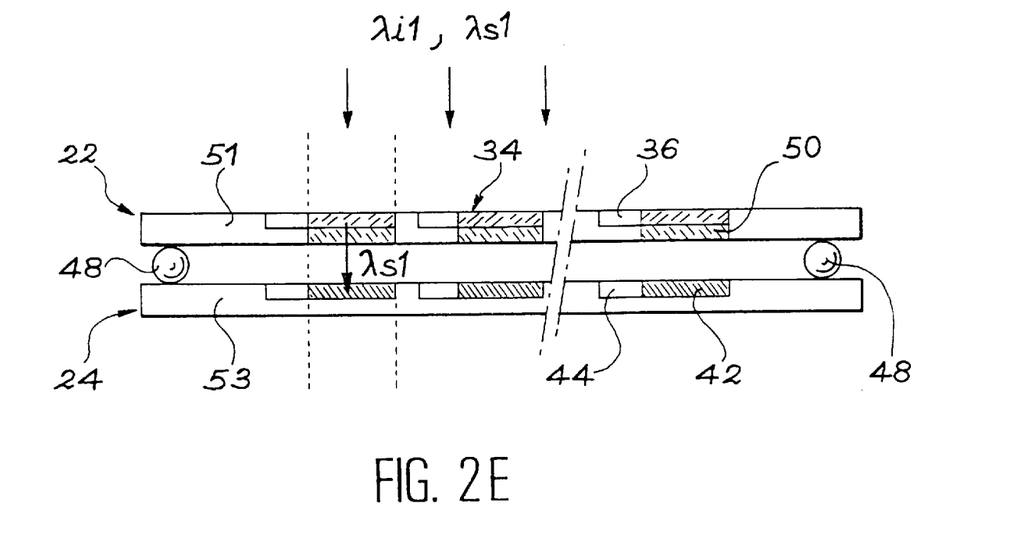

The detector according to the invention, which is schematically shown in cross-section in FIG. 2E, still includes component 22 in FIG. 2C, for which the detection circuit at wave length $\lambda i1$ is illuminated through its front surface.

In the case shown in FIG. 2E, the second component 24 comprises a detection circuit at wave length $\lambda s1$ which is associated with a reading circuit and is monolithically integrated into it.

FIG. 2E shows the matrix of detection pixels reference 42 at wave length $\lambda s1$, and the matrix of reading pixels at wave length $\lambda s1$ reference 44.

These matrices are formed on the substrate 53, this substrate 53 also being illuminated through its front surface on which detection pixels and reading pixels are located.

In the case shown in FIG. 2E, the connection elements 48 are used to mechanically fix the substrate 51 on which the detection circuit and the reading circuit at wave length $\lambda i1$ are formed, and the substrate 53 on which the detection and the reading circuit at wave length $\lambda s1$ are formed, and possibly to connect these two circuits electrically.

Figure 2F:
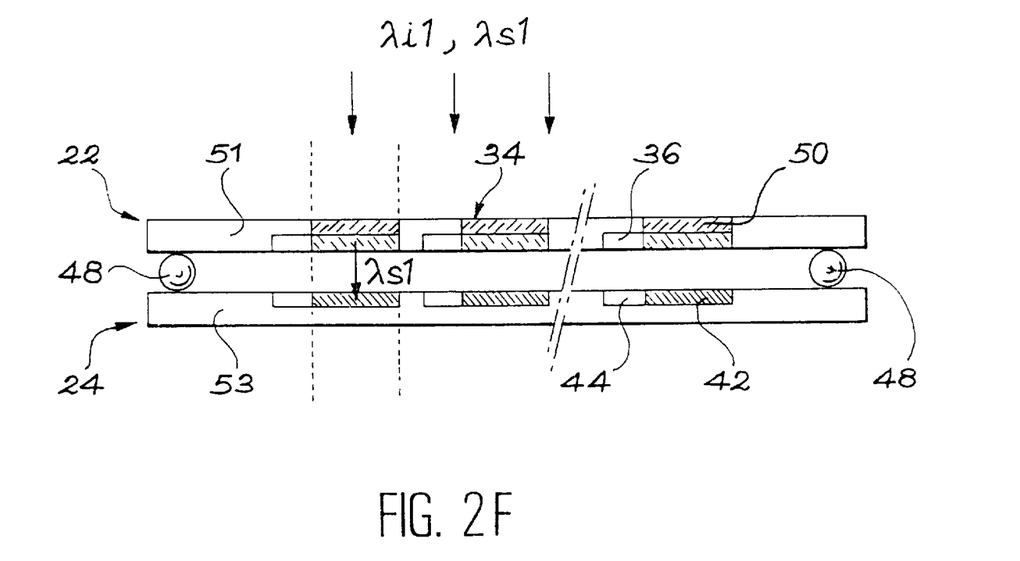

The detector according to the invention, which is schematically shown in cross-section in FIG. 2F, still comprises component 24 in FIG. 2E which is illuminated through its front surface.

This detector in FIG. 2F also includes component 22 in FIG. 2E, but in the case in this FIG. 2F, this component 22 was turned around so that it is illuminated through its rear surface in the case shown in FIG. 2F.

Note that in all FIGS. 2A to 2F, the side connection elements 48 provide mechanical strength to the set of components 22 and 24, and possibly form their electrical connection.

Their form and nature are chosen to give good cooling of the first component 22 that detects the wave length $\lambda i1$.

With reference to FIGS. 2A to 2F, it is obvious that an essential aspect of detectors according to this invention, which are shown in these figures, lies in the fact that component capable of detecting at wave length $\lambda i1$ makes use of a reading circuit transparent to incident radiation and particularly at wave length $\lambda s1$ in at least one portion of each pixel that carries the detection pixel at wave length $\lambda i1$ or which is facing the pixel detecting at wave length $\lambda i1$.

It is obvious that the configurations shown in FIGS. 2A to 2F are not the only possible configurations and that any assembly of two components that an expert in the field could deduce from these configurations would lie within the scope of this invention.

For example, this invention also relates to a component at wave length $\lambda s1$ that uses a detection circuit made by hetero-epitaxy on the lower surface of substrate 28 or 51 supporting the component at wave length $\lambda i1$ in the case shown in FIGS. 2A, 2C and 2E.

Furthermore, appropriate anti-reflection treatments may be formed on each of the various surfaces on the radiation path, in order to avoid radiation losses (particularly at wave length $\lambda s1$) related to reflections on them.

The following describes the advantages offered by this invention.

This invention can be implemented using existing technologies only, which is itself a major technical advantage since this guarantees reliability of the components manufactured using it.

Another advantage of this invention is in the total freedom that it leaves to choose the most suitable detection circuit for each wave length to be detected and for the target application, among the possible range described above.

For each pixel, the invention guarantees space-time consistency of the radiation corresponding to each of the two wave lengths to be detected.

With the invention, it becomes easy to make highly complex two-color detection assemblies, for example such as large two-dimensional mosaics, can be made while keeping the device small; very small inter-pixel pitches are thus possible.

It can also avoid intermodulation of signals corresponding to the two wave lengths to be detected.

All that is necessary is to insert a device between the two components used, to filter or absorb all wave lengths shorter than or equal to $\lambda i1$ in order to obtain a radiation at $\lambda s1$ free of any residual radiation at wave length $\lambda i1$.

Furthermore, in some specific embodiments (for example as defined in FIGS. 2B, 2D and 2F), the focal planes corresponding to each wave length to be detected may be coincident, which avoids the use of any additional optical system to optimize their positioning with respect to the detectors.

It is also possible to make a three-color or four-color detector in accordance with the invention.

In order to obtain a three-color detector, it is sufficient to use a "two-color" component 24a (FIG. 2G) as a second component, capable of detecting at wave length $\lambda s1$, but also at $\lambda s2$, where $\lambda s2$ is greater than $\lambda i1$, this component 24a being made using any method, for example such as the methods described in documents 1, 2 and 3.

Figure 2G:
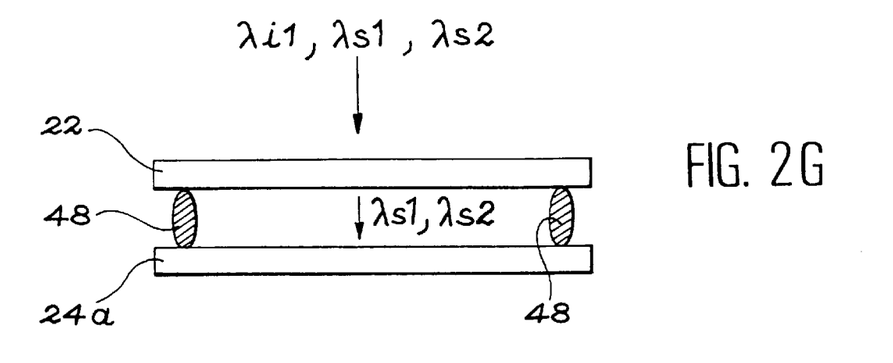
FIGS. 2G and 2H are schematic cross-sectional views of other detectors conform with the invention.

This component 24a is also connected to component 22 by elements 48.

Figure 2H:
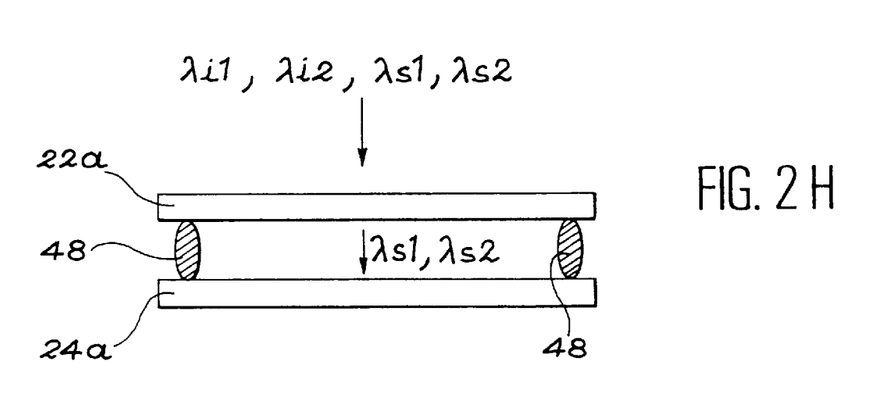

In order to obtain a four-color detector (FIG. 2H) all that is necessary is to use component 24a and, instead of component 22 detecting at wave length $\lambda i1$, a two-color component 22a detecting at wave length $\lambda i1$ and at wave length $\lambda i2$ where $\lambda i2<\lambda s1$ and $\lambda i2<\lambda s2$, and made using any method, for example such as the methods described in documents 1, 2 and 3.

We will now describe a method of making a detector according to the invention based on the architecture presented in FIG. 2b.

This detector is designed to operate at a temperature equal to or close to 77 K.

The component 22 detecting at $\lambda i1$ is a two-dimensional mosaic comprising 128×128 pixels with a pitch of 50 $\mu$m (a smaller pitch, for example 35 $\mu$m, would also be possible).

Its detection circuit 26 comprises a set of 128×128 N/P diodes made on a $Cd_xHg_{1-x}Te$ alloy where x is approximately 0.30, which will give detection to about 5 $\mu$m.

This alloy is deposited in a thin layer on a $Cd_{0.96}Zn_{0.04}Te$ substrate by epitaxy in liquid phase using well known techniques.

For example the matrix of diodes is made using the procedure described in document 9.

This detection circuit is then hybridized to a CMOS reading circuit on silicon (circuit 28), by means of a network of indium micro-balls.

The hybridization process for this case is also well known.

The reading circuit 28 used is made on a silicon substrate as transparent as possible to infrared to at least 10 μm. In particular, this substrate comprises a very low oxygen content.

It may be made thinner if required.

Furthermore, the topology of the reading circuit 28 is such that no technological treatment that could absorb incident infrared radiation between 3 and 10 μm is applied to any pixel over a large area of the silicon substrate.

Figure 3:
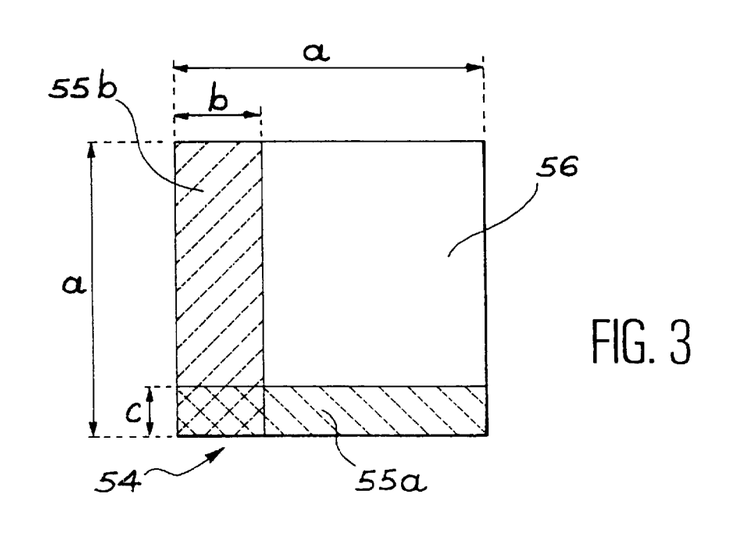
FIG. 3 is a schematic view of a pixel in the reading circuit of a detector conform with the invention.

FIG. 3 shows a schematic top view of a pixel 54 of this reading circuit.

Reference 55a represents an interconnection passage and reference 55b represents the active area of the pixel in the reading circuit that has a common part with the interconnection passage.

In the example shown in FIG. 3, the size of this common part is 8 μm×15 μm.

The top view of the pixel looks like a square with a (50 μm) side, the active area forms a rectangle with dimensions a×b (50 μm×15 μm) and the interconnection passage forms a rectangle with dimensions a×c (50 μm×8 μm).

The surface of area 56, which is transparent to at least 10 μm on each pixel, represents about 60% of the surface area of pixel 54.

Thus the filling factor of the two detection mosaics is about 60%.

Note that this filling factor may be increased by optimizing the design of this reading circuit with respect to this parameter and/or by the use of technological processes on silicon with smaller patterns.

Furthermore, the silicon substrate supporting reading circuit 28 is larger than the detection circuit 26 to enable connection of the two components 22 and 24 detecting at 5 μm and 10 μm respectively.

The topology of the detection circuit 26 is such that the diodes are made only on the surfaces facing reading circuit transparency areas after hybridization.

"Diode" means the entire optically active area, not just the area in which the junction is located.

Finally, the structure of each detection pixel is such that illumination is possible through the front surface, in other words the surface on which the N/P junction is deposited.

Figure 4A:
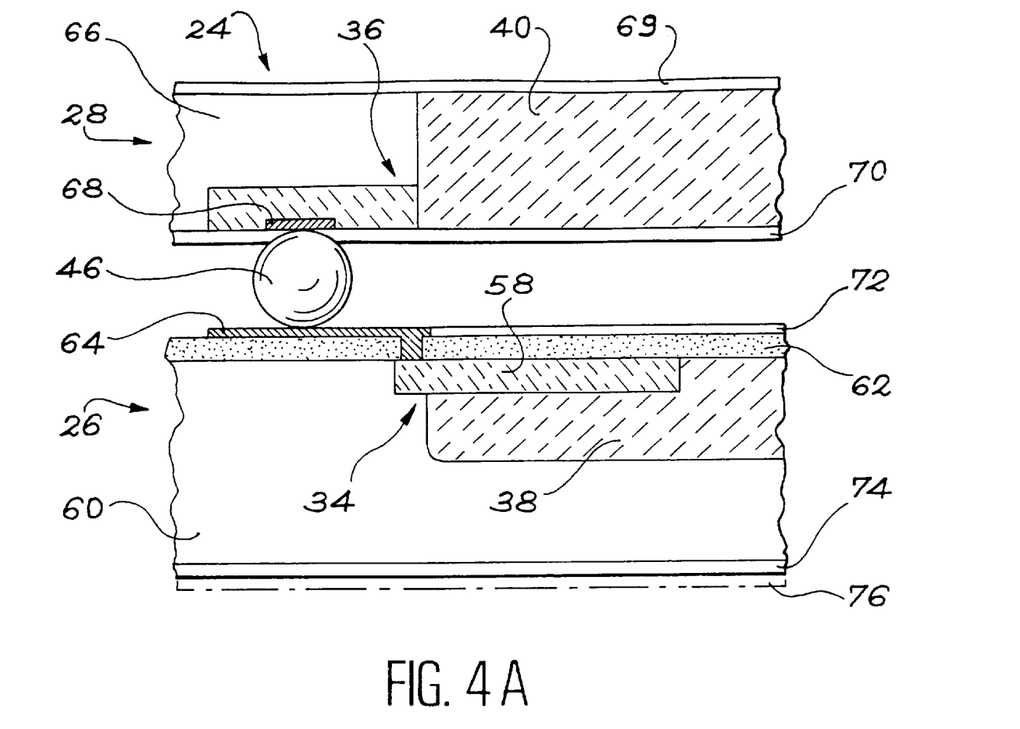
FIG. 4A is a schematic cross-sectional view of a hybridized detection pixel in a detector conform with the invention.

FIG. 4A is a schematic cross-sectional view of a hybridized detection pixel.

FIG. 4A shows:

the optically active area 38 of the detection pixel 34, the N type area 58 on this pixel 34, the P type CdHgTe layer 60 in which the detection pixels are formed, a passivation layer 62 that covers this layer 60, an electrical contact 64 associated with pixel 34 that is formed on layer 62 and is connected to area 58, the reading pixel 36 corresponding to pixel 34, the area 40 transparent at 5 μm and at 10 μm, the silicon substrate 66 in which the reading pixels 36 are formed, and, an electrical contact 68 associated with pixel 36 and connected to contact 64 through a micro-ball 46.

Figure 4B:
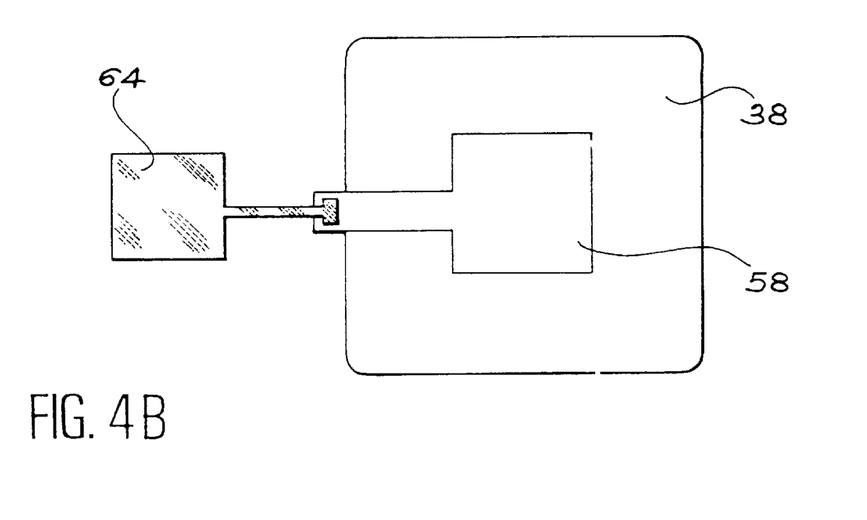
FIG. 4B is a schematic top view of the detection pixel in FIG. 4A.

The detection pixel 34 is shown schematically and partially in the top view shown in FIG. 4B.

Furthermore, the thickness of the CdHgTe layer may possibly be chosen large enough to practically block all radiation at 5 μm and thus minimize "pollution" of the signal at 10 μm by the signal at 5 μm; for example it may be 20 μm.

After hybridizing the detection circuit 26 onto the reading circuit 28, the $Cd_{0.96}Zn_{0.04}Te$ substrate is removed using a process presented in document 10.

This increases the resistance of the component during heating cycles (300 K –77 K) and also reduces the space between the two detection circuits, which reduces optical focusing problems.

Finally, anti-reflection coatings 69, 70, 72 and 74, are located on the rear surface of the reading circuit 28 (first interface to receive the incident radiation), the front surface of this circuit 28, the front surface of the detection circuit 26 and the rear surface of this detection circuit 26 (lower surface of component 22), respectively.

This final anti-reflection coating 74 deposited after the CdZnTe substrate has been removed, is specially optimized to be efficient at 10 μm (photons close to 5 μm lost by reflection will only reinforce the "spectral purity" of the signal at 10 μm).

If it is decided to work using a CdHgTe thickness that does not enable sufficient spectral filtering, a filter 76 can be added at this level that will only allow wave lengths exceeding 5 μm to pass.

Component 24 detecting at λs1 is a two-dimensional mosaic comprising 128×128 pixels with the same pitch and the same topology as the component 22 detecting at λi1.

Its detection circuit comprises a set of 128×128 N/P diodes made of $Cd_xHg_{1-x}Te$ alloy where x is close to 0.22, which gives detection up to about 10 μm.

This alloy is deposited as a thin layer (thickness of about 10 μm), on a $Cd_{0.96}Zn_{0.04}Te$ substrate by expitaxy in the liquid phase using well known techniques and the diode matrix is made, for example, using the process described in reference 9.

Active areas in the detection circuit of component 24 which is illuminated through its rear surface, have exactly the same topology as in the detection circuit in the component detecting at 5 μm.

This detection circuit is then hybridized to a CMOS reading circuit on silicon by means of a network of indium micro-balls using the same process as is used for manufacturing the component detecting at 5 μm.

The CdZnTe substrate is then removed using the same process as is used for this component detecting at 5 μm.

A 10 μm anti-reflection coating is then deposited on the rear surface of the 10 μm detection circuit.

The two components detecting at 5 μm and 10 μm respectively are connected through large diameter indium balls (typically 100 μm).

The precision of the hybridization process guarantees that the two components are correctly positioned with respect to each other.

Furthermore, these balls guarantee good thermal contact between the cold plane of the cryostat, through the component detecting at 10 μm, enabling operations of the detector at 77 K and the component detecting at 5 μm.

This contact may be improved if necessary by an appropriate design of the cryostat in which the cold pin of the cryostat would be partially located on the edges of the rear surface of the reading circuit of the component detecting at 5 μm.

However, it should be noted that although the operating temperature of the assembly is 77 K to ensure optimum performances for the component at 10 μm, the component at 5 μm does not strictly need a temperature of 77 K;

In fact, its performances will be practically unchanged until at least 120 K.

The following documents are referred to in this description:

1. E. F. Shulte, U.S. Pat. No. 5,113,076, May 12, 1992
2. M. B. Reine et al., Journal of Electronic Materials, vol 24, No. 5, 1995

3. P. R. Norton, U.S. Pat. No. 5,380,669, Jan. 10, 1995
4. M. W. Goodwin, U.S. Pat. No. 5,300,777, Apr. 5, 1994
5. M. W. Goodwin, U.S. Pat. No. 5,374,841, Dec. 20, 1994
6. J. Roschen, U.S. Pat. No. 3,962,578 Jun. 8, 1976
7. F. Marion, French patent request No. 93 13992, Nov. 23, 1993
8. P. R. Norton, U.S. Pat. No. 5,373,182 Dec. 13, 1994
9. G. L. Destefanis, "HgCdTe infrared diode arrays", Semicond. Sci. Technol., 6, 1991, p.88–92
10. J. L Tissot, F. Marion, 2nd NATO/IRIS Joint Symposium, London, Jun. 25–28, 1996.

I claim:

1. A multicolor radiation detector capable of detecting at least two incident radiation with two distinct wave lengths $\lambda i1$ and $\lambda s1$, where $\lambda s1 > \lambda i1$, comprising,
    a first detection component configured to detect at least the radiation with wave length $\lambda i1$ and to be transparent at least to the radiation of wave length $\lambda s1$, comprising:
        a matrix of detection pixels of n1 rows and m1 columns, and
        a matrix of reading pixels of n1 rows and m1 columns wherein a part of said matrix of reading pixels comprises reading pixels wherein at least one portion of each said reading pixel is transparent to the radiation with wave length $\lambda s1$;
    a second detection component configured to detect at least the radiation with wave length $\lambda s1$, comprising:
        a matrix of detection pixels of n2 rows and m2 columns, and
        a matrix of reading pixels of n2 rows and m2 columns;
    wherein said first detection component is configured to face incident radiation such that said first detection component receives the incident radiation of wave length $\lambda i1$ before said second detection component receives the radiation of wave length $\lambda s1$ and n1, m1, n2 and m2 are whole numbers equal to or greater than 1.

2. The multicolor radiation detector of claim 1, wherein said first detection component is further configured to detect another radiation of wave length $\lambda i2$ shorter than the wave length of each radiation that the second detection component is configured to detect.

3. The multicolor radiation detector of claim 1, wherein said second detection component is further configured to detect another radiation with wave length $\lambda s2$ longer than the wave length of each radiation that the first detection component is configured to detect.

4. The multicolor radiation detector of claim 1, wherein said detection circuit of at least one of the first and second detection components is hybridized to its respective reading circuit.

5. The multicolor radiation detector of claim 4, wherein each detection circuit and reading circuit is hybridized to the other by electrically conducting micro-balls.

6. The multicolor radiation detector of claim 1, wherein said detection circuit in at least one of the first and second detection components is monolithically integrated to its respective reading circuit.

7. The multicolor radiation detector of claim 1, wherein said first and second detection components have the same number of pixels, where n1 is equal to n2 and m1 is equal to m2.

8. The multicolor radiation detector of claim 1, wherein said first and second detection components have the same arrangement of pixels and the same pitch between pixels.

9. The multicolor radiation detector of claim 1, further comprising anti-reflection layers capable of preventing reflections of radiation to avoid radiation losses.

10. The multicolor radiation detector of claim 1, further comprising a filter configured to filter or absorb radiation with wave lengths less than or equal to each wave length that said second detection component is configured to detect.

11. The multicolor radiation detector of claim 1, wherein each reading circuit is based on silicon.

12. The multicolor radiation detector of claim 1, wherein said two incident radiation are infrared radiation.

* * * * *